(12) United States Patent
Sarkar et al.

(10) Patent No.: US 7,484,193 B2
(45) Date of Patent: Jan. 27, 2009

(54) METHOD AND SOFTWARE FOR PREDICTING THE TIMING DELAY OF A CIRCUIT PATH USING TWO DIFFERENT TIMING MODELS

(75) Inventors: Aveek Sarkar, Mountain View, CA (US); Shian-Jiun Fu, Sunnyvale, CA (US); Peter Lai, San Jose, CA (US); Rambabu Pyapali, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 557 days.

(21) Appl. No.: 10/651,113

(22) Filed: Aug. 28, 2003

(65) Prior Publication Data

US 2005/0050405 A1    Mar. 3, 2005

(51) Int. Cl.
   *G06F 17/50* (2006.01)
(52) U.S. Cl. .............................. 716/6; 716/1
(58) Field of Classification Search ............ 716/4, 716/6, 1; 703/13–15, 19, 22
   See application file for complete search history.

(56) References Cited

U.S. PATENT DOCUMENTS

| | | | | |
|---|---|---|---|---|
| 5,168,455 A * | 12/1992 | Hooper | .................... | 716/18 |
| 5,274,568 A * | 12/1993 | Blinne et al. | .................. | 716/6 |
| 5,508,937 A * | 4/1996 | Abato et al. | .................... | 716/6 |
| 5,655,109 A * | 8/1997 | Hamid | ..................... | 716/18 |
| 5,801,970 A * | 9/1998 | Rowland et al. | ................ | 703/6 |
| 5,867,399 A * | 2/1999 | Rostoker et al. | ............. | 716/18 |
| 5,883,818 A * | 3/1999 | Salimi et al. | ................... | 716/2 |
| 6,012,833 A * | 1/2000 | Yoshikawa | ................ | 700/121 |
| 6,028,995 A * | 2/2000 | Jetton et al. | ................... | 703/19 |
| 6,178,395 B1 * | 1/2001 | Gee | ............................ | 703/22 |
| 6,367,056 B1 * | 4/2002 | Lee | ............................. | 716/5 |
| 6,405,352 B1 * | 6/2002 | Spencer et al. | ................ | 716/6 |
| 6,463,567 B1 * | 10/2002 | Kozai | ........................... | 716/2 |
| 6,487,705 B1 * | 11/2002 | Roethig et al. | ................. | 716/6 |
| 6,604,066 B1 * | 8/2003 | Hatsuda | ....................... | 703/19 |
| 6,672,776 B1 * | 1/2004 | Limqueco et al. | ............. | 716/1 |
| 6,789,248 B1 * | 9/2004 | Lu et al. | ....................... | 716/18 |
| 6,810,505 B2 * | 10/2004 | Tetelbaum et al. | ............ | 716/1 |
| 6,813,753 B2 * | 11/2004 | Jones | ............................ | 716/6 |
| 6,834,379 B2 * | 12/2004 | Kidd et al. | ..................... | 716/6 |
| 6,912,702 B1 * | 6/2005 | Iyer et al. | ...................... | 716/6 |
| 6,925,621 B2 * | 8/2005 | Mielke et al. | .................. | 716/6 |
| 7,039,881 B2 * | 5/2006 | Regan | ........................... | 716/3 |

(Continued)

OTHER PUBLICATIONS

"Synopsys and Texas Instruments", product description, 6 pages, Synopsys, Inc., copyright 1999.

(Continued)

*Primary Examiner*—Paul Dinh
*Assistant Examiner*—Patrick Sandoval
(74) *Attorney, Agent, or Firm*—Dorsey & Whitney LLP (57) ABSTRACT

The timing response of a circuit path is predicted by modeling the circuit path using two different timing models. The variation between the timing responses produced by each of the timing models is used to generate a correction factor, which is then applied to one of the timing models. Once the correction factor has been applied to a timing model, the model is used to produce a corrected timing prediction for the modeled circuit path.

35 Claims, 5 Drawing Sheets

U.S. PATENT DOCUMENTS

| | | | |
|---|---|---|---|
| 7,043,708 B2 * | 5/2006 | Tetelbaum et al. | 716/6 |
| 7,107,558 B2 * | 9/2006 | Tetelbaum et al. | 716/6 |
| 7,111,261 B2 * | 9/2006 | Jones | 716/6 |
| 7,149,991 B2 * | 12/2006 | Kovacs-Birkas et al. | 716/6 |
| 7,174,523 B2 * | 2/2007 | Engel et al. | 716/6 |
| 2004/0002844 A1 * | 1/2004 | Jess et al. | 703/14 |
| 2005/0065765 A1 * | 3/2005 | Visweswariah | 703/19 |
| 2007/0050742 A1 * | 3/2007 | Yonezawa | 716/6 |
| 2008/0209376 A1 * | 8/2008 | Kazda et al. | 716/6 |

OTHER PUBLICATIONS

Yalcin, et al. "An Advanced Timing Characterization Method Using Mode Dependency", Proceedings of the 38th Conference on Design Automation (DAC'01), pp. 657-660, Jun. 18-22, 2001.

Agah, Hamid, "Physical Synthesis", Application Note: FPGAs, from XILINX®, XAPP140, (v1.0), 3 pages, Xilinx, Inc., Feb. 26, 2001.

"PathMill: Transistor-Level Static Timing Analysis", 3 pages, Sysnopsys Products & Solutions, Synopsys, Inc., downloaded from http://www.synopsys.com/products, on or about May 2003.

Bray, Jeffrey, Sr., "Verifying timing of external IP key to SoC success", EE Times, May 28, 2002, 3 pages, downloaded from http://www.eetimes.com, May 14, 2003.

"Transistor and gate level full chip timing analysis and automatic block characterization", product description from Dyna, 3 pages, downloaded from www.circuitsemantics.com, May 14, 2003.

"PrimeTime Synopsys Static Timing Solution", 13 pages, Jul. 29, 1999, Revision 1.9, Sysnopsys Products & Solutions, Synopsys, Inc., downloaded from http://www.synopsys.com/products on Jun. 5, 2003.

* cited by examiner

| 310 Input | 320 Estimated Timing Coarse | 330 Estimated Timing Refined | 340 Δ | 350 (Avg Δ) Correction Factor | 360 Corrected |
|---|---|---|---|---|---|
| 1 (201) <260> | 89 | 86 | -3 | -3 | 86 |
| 2 (202) <262> | 86 | 84 | -2 | -3 | 83 |
| 3 (203) <264> | 94 | 90 | -4 | -3 | 91 |
| 4 (204) | 91 | ///// | ///// | -3 | 88 |
| 5 (205) | 92 | ///// | ///// | -3 | 89 |
| 6 (206) | 84 | ///// | ///// | -3 | 81 |
| 7 (207) | 93 | ///// | ///// | -3 | 90 |
| 8 (208) | 86 | ///// | ///// | -3 | 83 |

Selected 370: inputs 1-3
Unselected 380: inputs 4-8

METHOD AND SOFTWARE FOR PREDICTING THE TIMING DELAY OF A CIRCUIT PATH USING TWO DIFFERENT TIMING MODELS

FIELD OF THE INVENTION

The invention relates generally to analyzing circuit timing, and more particularly to improving the accuracy and/or speed of circuit path timing predictions.

BACKGROUND

As the speed at which processors and other circuits operate has increased, the focus of many circuit design techniques has shifted towards ensuring compliance with stringent timing requirements. To make sure that circuits they design conform to these stringent timing requirements, circuit designers use a number of different timing prediction/modeling tools. Many of these tools generate timing models of a circuit using pre-constructed models of common elements or groups of elements stored in library files. Many of these tools also use simplified equations based on generalized assumptions. Because of the way in which these modeling tools operate, the circuit timing estimates they generate are often not completely accurate.

Other, more accurate modeling tools are available. Their accuracy, however, comes at the expense of speed. In order to achieve greater accuracy, these more accurate modeling tools generally employ more complex equations, and/or take into account a larger universe of variables in generating timing estimates. Unfortunately, when dealing with modern circuits having millions of transistors, these more accurate tools are too slow to use for analyzing all of the signal paths in a circuit.

Consequently, circuit designers are often placed in the unenviable position of choosing between using fast modeling tools providing relatively inaccurate results, and tools that are significantly slower but provide more accurate results. It should be apparent, therefore, that an improved way of modeling the timing of complex circuits would be advantageous.

SUMMARY

The timing response of a circuit path is predicted by modeling the circuit path using two different timing models. The variation between the timing responses, produced by each of the timing models is used to generate a correction factor, which is then applied to one of the timing models. Once the correction factor has been applied to a timing model, the model is used to produce a corrected timing prediction for the modeled circuit path.

The correction factor can be used to correct coarse timing predictions for a large number of circuit paths in a relatively short period. For example, one of the two different timing models may be used to obtain coarse timing response estimates for all of the circuit paths in a particular design block. The other timing model may be used to obtain a refined timing estimate of one or more selected circuit paths from the same design block. The coarse estimate and the refined estimate for the selected circuit paths are compared, and a correction factor is generated. The correction factor can then be used to adjust the coarse timing estimates of all the circuit paths—not just the selected circuit paths.

In most cases, the coarse estimate will be less accurate than the refined estimate, because the model generating the coarse estimate makes more modeling assumptions, use pre-calculated library estimates, etc. For the same reasons, however, it will generally be quicker to obtain the coarse timing estimates than to obtain the refined timing estimates. Consequently, by generating a correction factor based on variations between the coarse timing estimates and the refined timing estimates, and by adjusting the coarse timing estimates based on the correction factor, the accuracy of the coarse timing estimates can be improved without requiring the timing of each circuit path to be predicted using the slower, but more accurate, refined timing model.

The improved method of predicting the timing response of a circuit path described above may be implemented as a program of instructions encoded into a computer readable medium to be executed by a data processor. Such a program of instructions may be used as part of a program specifically designed to implement the teachings set forth herein, or in conjunction with other modeling tools commonly available, such as Pathmill®, Dynacore®, and Simulation Program for Integrated Circuits Emphasis (SPICE).

The method and/or software described in the present disclosure may also be used to produce a computer readable medium encoding an integrated circuit design. Such a computer readable medium may be useful for transferring circuit design information to semiconductor foundries, for transferring information between design groups, and the like.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
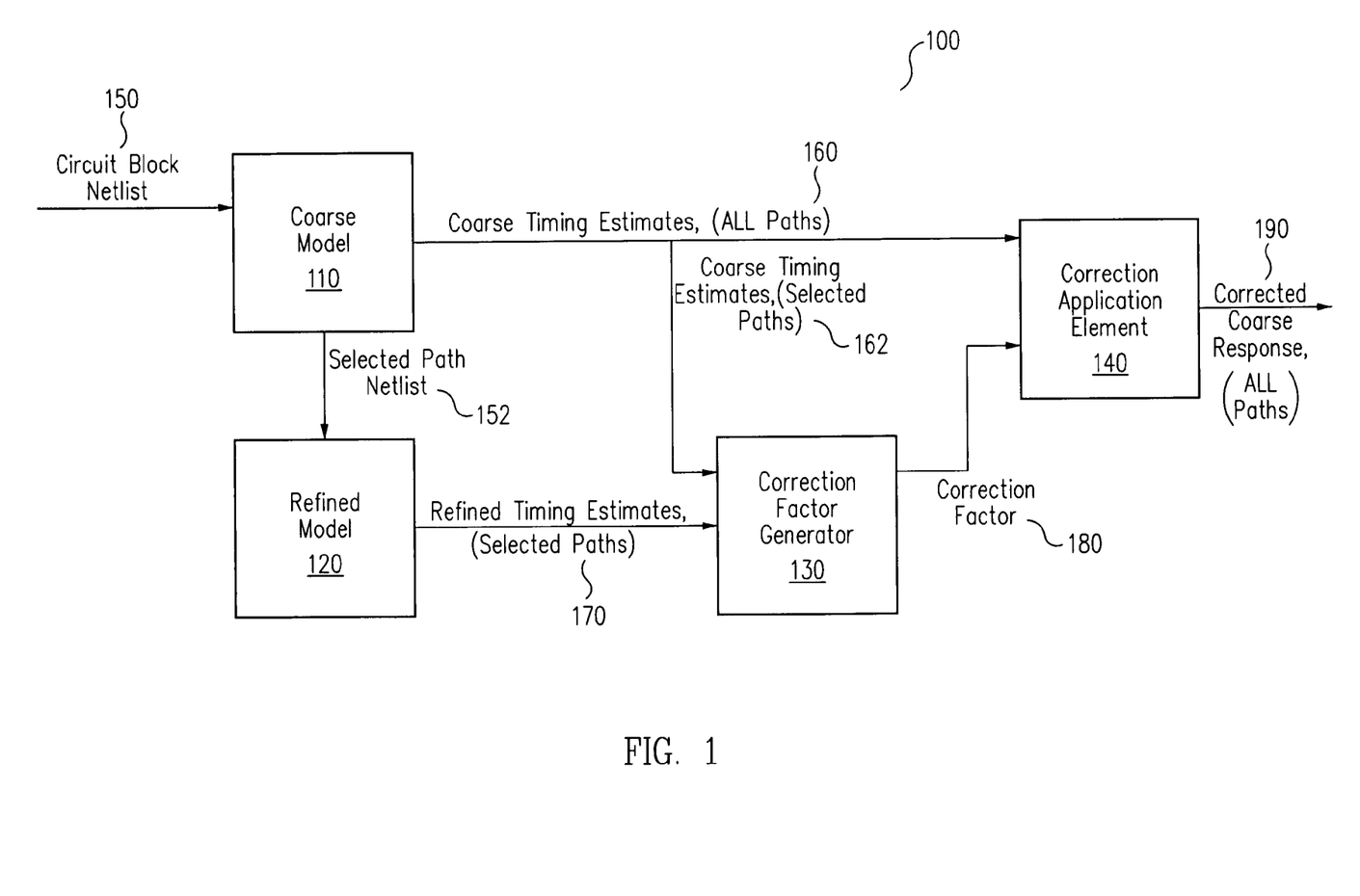
FIG. 1 is a block diagram illustrating processing elements used to generate timing estimates for substantially all timing paths through a circuit block, according to one embodiment of the invention.

FIG. 1 illustrates a system 100 according to an embodiment of the present invention. System 100 includes various computational or processing elements that may be used to generate an improved timing estimate for many timing paths in a custom circuit block by using a few selected paths to generate a correction factor, and then applying that correction factor to all of the timing paths, including the unselected timing paths. The elements illustrated in FIG. 1 include Coarse Model element 110 and Refined Model element 120 for modeling timing paths, Correction Factor Generator 130 for generating a correction factor 180 indicating a variance between the timing estimates generated by Coarse Model element 110 and Refined Model element 120, and Correction Application element 140 for applying the correction factor 180 to timing estimates generated by Coarse Model element 110.

In one form, system 100 receives a description of a custom circuit design block, such as Circuit Block Netlist 150, at Coarse Model element 110. Circuit Block Netlist 150 may be a node-level description of a circuit to be modeled, a component level description, or some other type of circuit description suitable for use by Coarse Model element 110. Circuit Block Netlist 150 may include a description of an entire electronic circuit, a specific functional circuit block, or any other portion of an electronic circuit to be modeled. In many cases, the circuit described by Circuit Block Netlist 150 will include hundreds or even thousands of possible timing paths, with each path representing a series of components or blocks that an electronic signal must travel to move from an input of the circuit to an output of the circuit.

Coarse Model element 110 identifies the timing paths in the circuit block described by Circuit Block Netlist 150, and generates Coarse Timing Estimates 160 for all or substantially all identified timing paths. Coarse Timing Estimates 160 may include estimates of signal propagation times, estimates of signal propagation delays, and the like. To generate timing estimates quickly, Coarse Model element 110 employs a coarse timing model that incorporates the use of simplified timing assumptions and/or pre calculated values obtained from a library/database of known elements. For example, in modeling the timing response of a transistor, Coarse Model element 110 may disregard certain capacitance values, such as Miller capacitance, and second order effects such as non-linearity of the rise and fall times of the input signals. Alternatively, Coarse Model element 110 may use a time estimate calculated in advance for an average transistor, or extrapolate a time estimate from a lookup table.

In at least one embodiment, Coarse Model element 110 also generates a node-level description of selected timing paths, such as Selected Path Netlist 152, and provides the Selected Path Netlist 152 to Refined Model element 120. It should be noted, however, that Selected Path Netlist 152 may need to be verified before being provided to Refined Model element 120, due to possible errors that may be introduced in the modeling process by Coarse Model element 110. For example, Coarse Model element 110 may ignore certain devices described in the original netlist, Circuit Block Netlist 150, because delays introduced by the ignored devices are assumed by Coarse Model element 110 to be inconsequential.

In other embodiments, however, Coarse Model element 110 does not generate Selected Path Netlist 152, or if Coarse Model element 110 does generate a netlist, the netlist is not provided to Refined Model element 120. In such an embodiment, portions of Circuit Block Netlist 150 defining selected paths may be delivered directly to Refined Model element 120 upon receipt by System 100. Despite the possible inaccuracies of netlists generated by Coarse Model element 110, however, it may be more efficient to have Coarse Model element 110 to generate Selected Path Netlist 152, and then verify any suspect timing paths, than to construct Selected Path Netlist 152 by hand or otherwise.

Selected Path Netlist 152 is, in at least one embodiment, a node-level netlist describing particular timing paths selected from the universe of timing paths described in Circuit Block Netlist 150. The timing paths included in Selected Path Netlist 152 may be chosen manually, chosen by Coarse Model element 110, or otherwise. The process by which timing paths are selected for inclusion in Circuit Block Netlist 150 may be random, pseudo random, based on maximum or minimum timing requirements, based on the number of circuit elements in a path, based on circuit layout requirements, based on a desired circuit characteristic, or the like.

Refined Model element 120 receives Selected Path Netlist 152 from Coarse Model element 110, and generates refined timing estimates 170 for each of the paths described in Selected Path Netlist 152. Refined timing estimates 170 may include estimates of signal propagation times, estimates of signal propagation delays, and the like. Refined Model element 120 generates more accurate timing estimates than the timing estimates generated by Coarse Model element 110, because Refined Model element 120 makes fewer simplifying assumptions, and does not rely on precalculated library values. In addition, Refined Model element 120 may also take into account secondary effects such as Miller capacitances, certain parameters used in SPICE models, and multi-leg switching scenarios, and/or use otherwise more precise modeling algorithms.

Coarse Model element 110 generates course timing estimates for all paths 160. Included in these coarse timing estimates, are coarse timing estimates for the selected paths 162. It should also be noted that, although in the illustrated embodiment Coarse Model element 110 initially generates coarse timing estimates for all paths 160, and the coarse timing estimates for selected paths 162 are chosen from among the coarse timing estimates for all paths 160, in other embodiments Coarse Model element 110 initially generates only the coarse timing estimates for the selected paths 162 needed by Correction Factor Generator 130. Any remaining coarse timing estimates may then be generated after correction factor 180 has been generated.

The coarse timing estimates for the selected paths 162 and the refined timing estimates for the selected paths 170 are both provided to correction factor generator 130. Correction Factor Generator 130 uses the coarse timing estimates for selected paths 162 and the refined timing estimates for selected paths 170 to determine any variation between the coarse and refined timing estimates for each selected path, and then to generate a correction factor 180 based on that variation. The way in which Correction Factor Generator 130 generates correction factor 180 will be discussed in greater detail with reference to FIG. 3.

Once correction factor 180 has been generated, Correction Application element 140 uses correction factor 180 to generate a corrected coarse response for all paths 190. Correction Application element 140 adjusts the coarse timing estimates for all paths 160 based on correction factor 180. For example, if correction factor 180 is a simple offset, then Correction Application element 140 adds the offset to the coarse timing estimate to produce corrected timing responses. If correction factor 180 is a scaling factor, then Correction Application element 140 multiplies the coarse timing estimates by the correction factor. If correction factor 180 is a more complex statistical function, then Correction Application element 140 applies the function to the coarse timing estimates.

It will be appreciated that although FIG. 1 illustrates Correction Application Element 140 as physically separate from Coarse Model element 110, in other embodiments Coarse Model element 110 includes hardware and/or software components for implementing the functions of Correction Application Element 140. In such a case, correction factor 180 is applied to the Coarse Model element 110, and corrected coarse responses are provided directly from Coarse Model 110.

Figure 2:
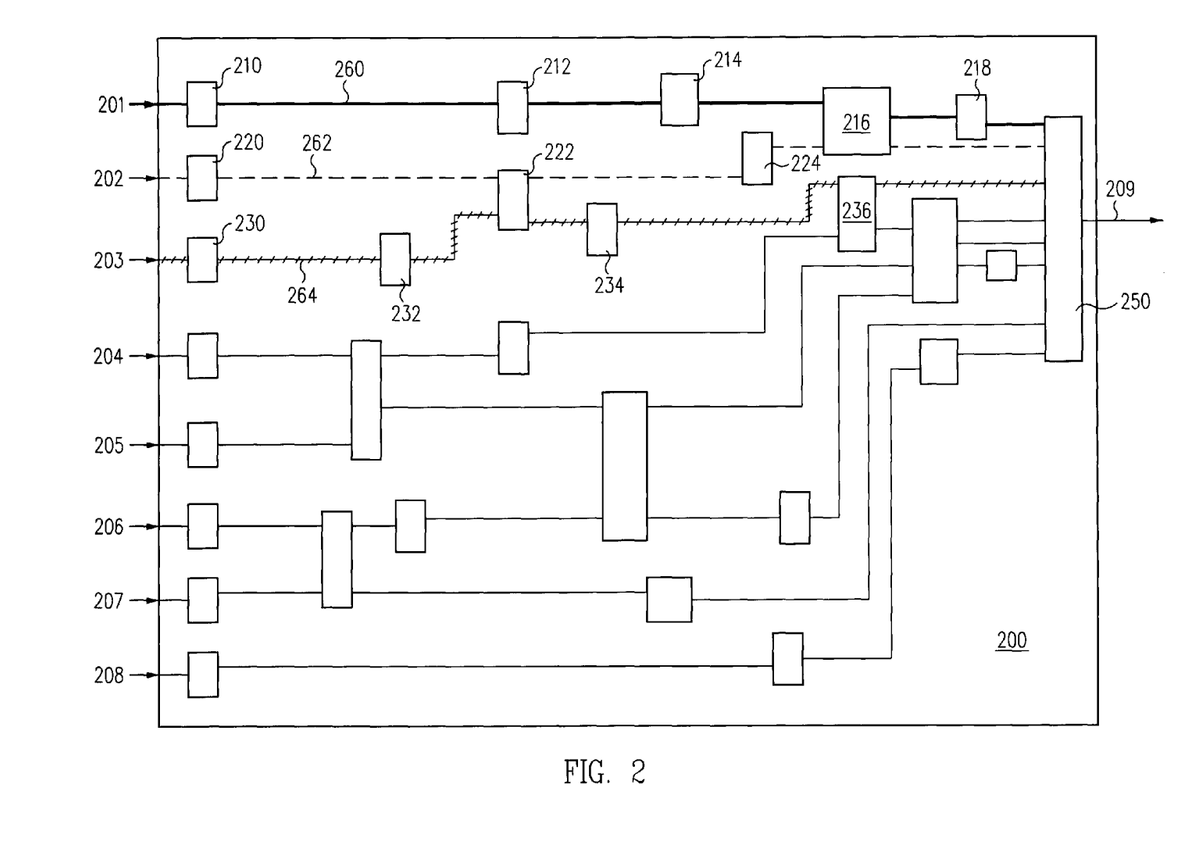
FIG. 2 is a block diagram illustrating a custom designed circuit block having multiple timing paths, according to one embodiment of the invention.

Referring next to FIG. 2, a block diagram of a circuit having multiple timing paths is illustrated, and designated generally as circuit block 200. Circuit block 200 includes eight inputs 201-208, output 209, and various circuit elements 210-250. Any signal traveling from one of the inputs 201-208 to output 209 moves along a timing path. For example, a signal traveling from input 201 to output 209 travels along path 260, a signal traveling from input 202 travels along path 262, and a signal traveling from input 203 to output 209 travels along path 264. The Coarse Model element 110 (FIG. 1) and Refined Model element 120 (FIG. 1) operate on netlists, or other similar descriptions of circuit block 200 familiar to those skilled in the art, to generated either coarse or refined estimates, respectively, of how long it will take a signal to travel along a particular path such as paths 260, 262, or 264. It will be appreciated that circuit block 200 is highly simplified, and that circuit blocks typically have multiple outputs as well as multiple inputs, so that a particular input may have paths to multiple outputs, a single input may have multiple paths to a single output, etc. For ease of discussion, however, each input 201-208 is constrained to have only a single path to output 209.

Figure 3:
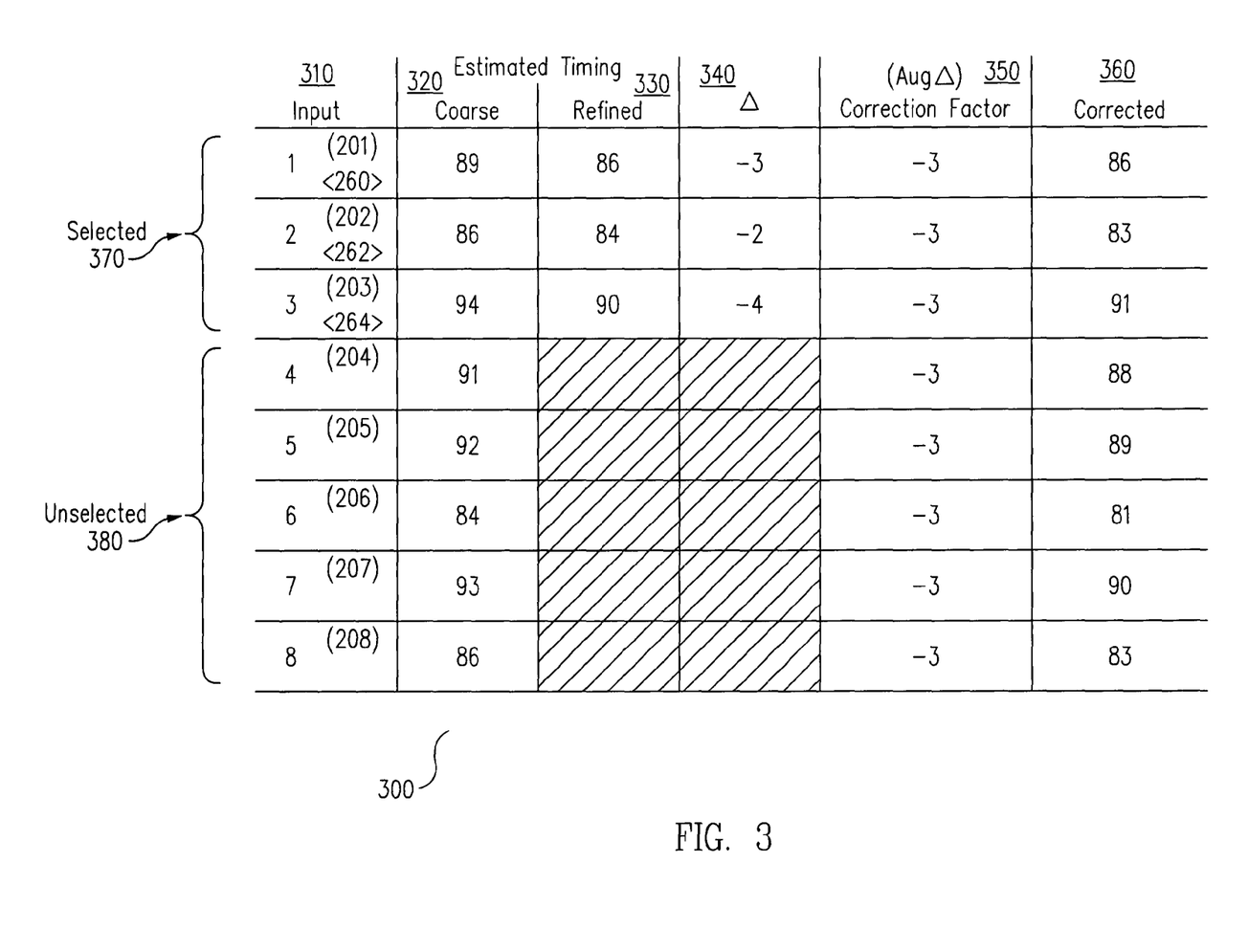
FIG. 3 is a chart showing the application of a correction factor, generated using selected timing paths in a circuit block, to multiple timing paths in the circuit block according to one embodiment of the invention.

Referring now to FIGS. 2 and 3, a method according to an embodiment of the present invention will be discussed. Chart 300 includes input column 310, coarse estimated timing column 320, refined estimated timing column 330, variance column 340, correction factor column 350 and corrected column 360. Input column 310 includes input designators 1-8, which represent inputs 201-208, respectively, of circuit block 200. As noted above, to simplify discussion each input 201-208 of illustrated circuit block 200 has only one path to output 209. Consequently, rows 1-8 each include information associated with a respective path for which timing is to be estimated. For example, row 1 includes information for path 260, which is the path from input 201 to output 209. Likewise, row 2 includes information for path 262, and row 3 includes information for path 264. The remaining rows 4-8 include information for paths beginning at input 204-208, respectively. Note that rows 1-3 are designated as selected 370, and rows 4-8 are designated as unselected 380. The rows designated as selected 370 include information for paths chosen to have both coarse and refined timing estimates generated.

A method according to one embodiment begins with Coarse Model element 110 (FIG. 1) generating coarse timing estimates for all selected paths 370 and unselected paths 380. Exemplary values for the coarse timing estimates are listed in column 320. No units are included chart 300, but those skilled in the art will recognize that the values may be given in milliseconds, microseconds, or any other suitable unit of time, depending on the speed of the circuit being analyzed. Refined timing estimates are generated for each of the selected paths 370. Column 330 shows exemplary values for each of the selected timing paths.

Note that no refined timing estimate is performed on the majority of the timing paths, while coarse timing estimates are performed on all of the timing paths. Each coarse timing estimate can normally be obtained much quicker than a corresponding refined timing estimate. For example, in many cases a coarse timing estimate can be obtained for all paths of a complicated circuit in a matter of hours, while performing a refined estimate for the same paths might take a matter of days. Consequently, the time savings obtained by performing timing analysis using the methods described herein can be significant.

Some or all of the refined timing estimates in column 330 may or may not be the same as the coarse timing estimates in column 320, depending on the circuit being evaluated, the accuracy of coarse timing model, etc. Generally, however, at least some of the refined timing estimates are different from the coarse timing estimates. These differences are illustrated by the values in variance column 340. In the present example, the variance is illustrated as a difference between the coarse and refined timing estimates. This variance is then used to generate a correction factor, examples of which are shown in column 350.

The Correction Factor Generator (FIG. 1) generates the correction factor, shown in Column 350, based on the variances in column 340. In the illustrated example, the correction factor is the average variance between the coarse and refined estimated responses for all of the selected paths 370. The variance of path 260, shown in row 1, is −3, since the coarse timing estimate was 89 and the refined timing estimate was 86. The variance in path 262, shown in row 2, is −2, since the coarse timing estimate was 86 and the refined timing estimate was 84. The variance in path 264, shown in row 3, is −4. The average of these three variances (−3, −2, and −4) is −3. This average variance is chosen as a correction factor, and then applied to all of the timing paths, such that the corrected estimated timing shown in column 360 represents the coarse timing in column 320 adjusted by the correction factor shown in column 350. As a result, the corrected timing estimate for path 260 is 86, the corrected timing estimate for path 262 is 83, and the corrected timing estimate for path 264 is 91. The correction factor is likewise applied to the unselected timing paths 380, so that the relatively large number of timing paths that were not evaluated using the refined timing model are adjusted by an amount determined by the variance between the coarse and refined timing estimates of a relatively smaller number of timing paths.

Note that although the correction factor discussed in relation to FIG. 3 is a simple average of the variances, other suitable correction factors may be used. For example, the mean of the variances of all selected paths may be used as a correction factor. Alternatively, the correction factor may be a more complex function related to the number of circuit elements in a particular path. For example, assume that three paths were analyzed, with variances of +1, +2 and +3, respectively. Assume furthermore that the first path includes 10 elements, the second path includes 20 elements, and the third path includes 30 elements. In such a case, an average correction factor of +2 might be applied, or a correction factor of +1 for each 10 elements might be applied. In that case, a different correction factor might be applied to a particular path depending on how many circuit elements were in the path. For example, any path that included 40 elements would have a +4 correction applied, while a path including only 5 elements would have a +0.5 correction applied. Similarly, other functions including offsets, multiplication factors, or any suitable mathematical formula may be used as a correction factor.

In at least one embodiment, a statistical analysis is performed on the variances of all selected timing paths. Such a statistical analysis can include a determination of a coefficient of variation, so that if the coarse-refined timing difference, i.e. the statistical variation (variance) of a particular path, is highly positive for some paths and highly negative for others, then one or more timing paths may be flagged for verification by hand or otherwise. For example, a statistical variation may be determined by first generating a correction factor for selected paths in a design block. Next, the standard deviation and mean of the correction factors are determined, and a ratio of the standard deviation to the mean is calculated. When the ratio exceeds a certain value, for example 20% percent, each of the correction factors will be verified. Statistical analysis may also be used to help select the proper number of paths for both coarse and refined timing analysis. For example, if there are 10,000 possible paths, a statistically significant number of paths may be selected to improve the likelihood that any correction factor generated by Correction Factor Generator 130 (FIG. 1) will be accurate.

Figure 4:
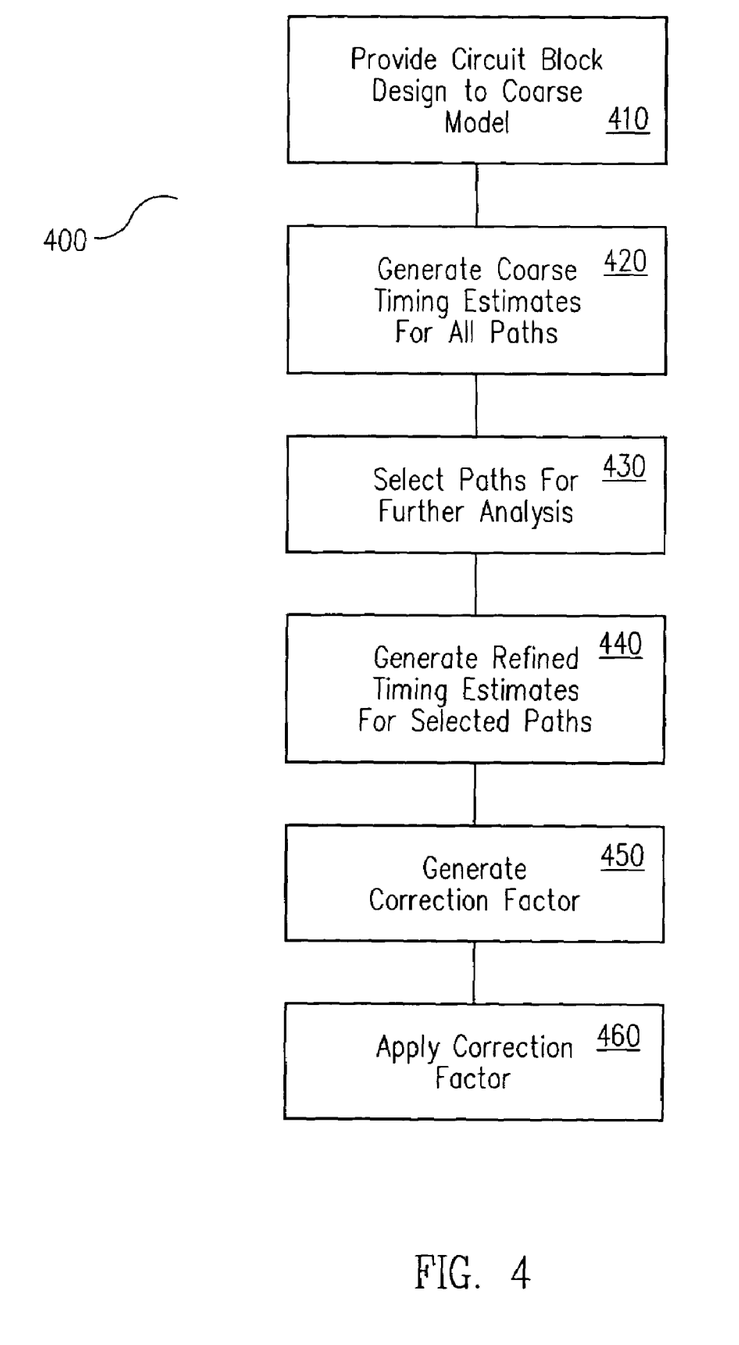
FIG. 4 is a flow chart illustrating a method according to one embodiment of the invention.

Referring next to FIGS. 1 and 4, a flowchart describing a method according to an embodiment of the present invention will be discussed, and is designated generally as method 400. The method 400 begins at step 410, when a circuit block design is provided to Coarse Model element 110. The circuit block design may be provided in the form of a netlist, or a schematic or other representation of the circuit design may be delivered to Coarse Model element 110. In the case where the circuit design is provided to Coarse Model element 110 in a schematic form, Coarse Model element 110 extracts a netlist or some other suitable description of the circuit. Various ways of providing a circuit description to Coarse Model 110 are known to those skilled in the art.

The method proceeds to step 420, in which Coarse Model element 110 generates one or more coarse timing estimates. In at least one embodiment, Coarse Model element 110 generates coarse timing estimates for all of the paths in the circuit, but in other embodiments Coarse Model element 110 generates coarse timing estimates for only a selected portion of the circuit paths. If Coarse Model element 110 generates coarse timing estimates for all the circuit paths, step 430 is performed to select some of the circuit paths for further analysis by Refined Model element 120. The circuit paths may be selected randomly, by use of a statistical formula, based on a maximum or minimum timing criterion, or by any other suitable method.

In step 440, Refined Model 120 generates refined timing estimates for the paths selected in step 430. Once the selected paths have been analyzed by both Coarse Model element 110 and Refined Model element 120, step 450 is performed, in which Correction Factor Generator 130 generates a correction factor based on the variance between the refined timing estimate and the coarse timing estimate for each selected path. Finally, the correction factor is applied to the coarse timing model and/or the coarse timing estimates are adjusted based on the correction factor.

The method illustrated in FIG. 4, as well as the methods discussed earlier with reference to FIGS. 1-3, can be implement as a program of instructions executed using a data processor. For example, each of the major elements shown in FIG. 1 may be implemented as a subroutine, a stand alone program, or the like. In at least one embodiment, off-the shelf timing analysis tools are used to implement Coarse Model element 110 and Refined Model element 120. The output of these off-the-shelf tools is then used in combination with software subroutines, programs, etc. used to implement Correction Factor Generator 130 and Correction Application element 140.

In one form, the teachings set forth herein may be used to produce a computer readable medium product that encoded with a circuit design. Such a circuit design may be provided, in the form of a computer readable medium product, to foundries or other design facilities, for prototyping, manufacturing, further design, etc. The computer readable medium product may include a random access memory, a read only memory, a magnetic tape, a magnetically encodable disk, an optically encodable tape, an optically encodable disk, or a propagated signal.

Figure 5:
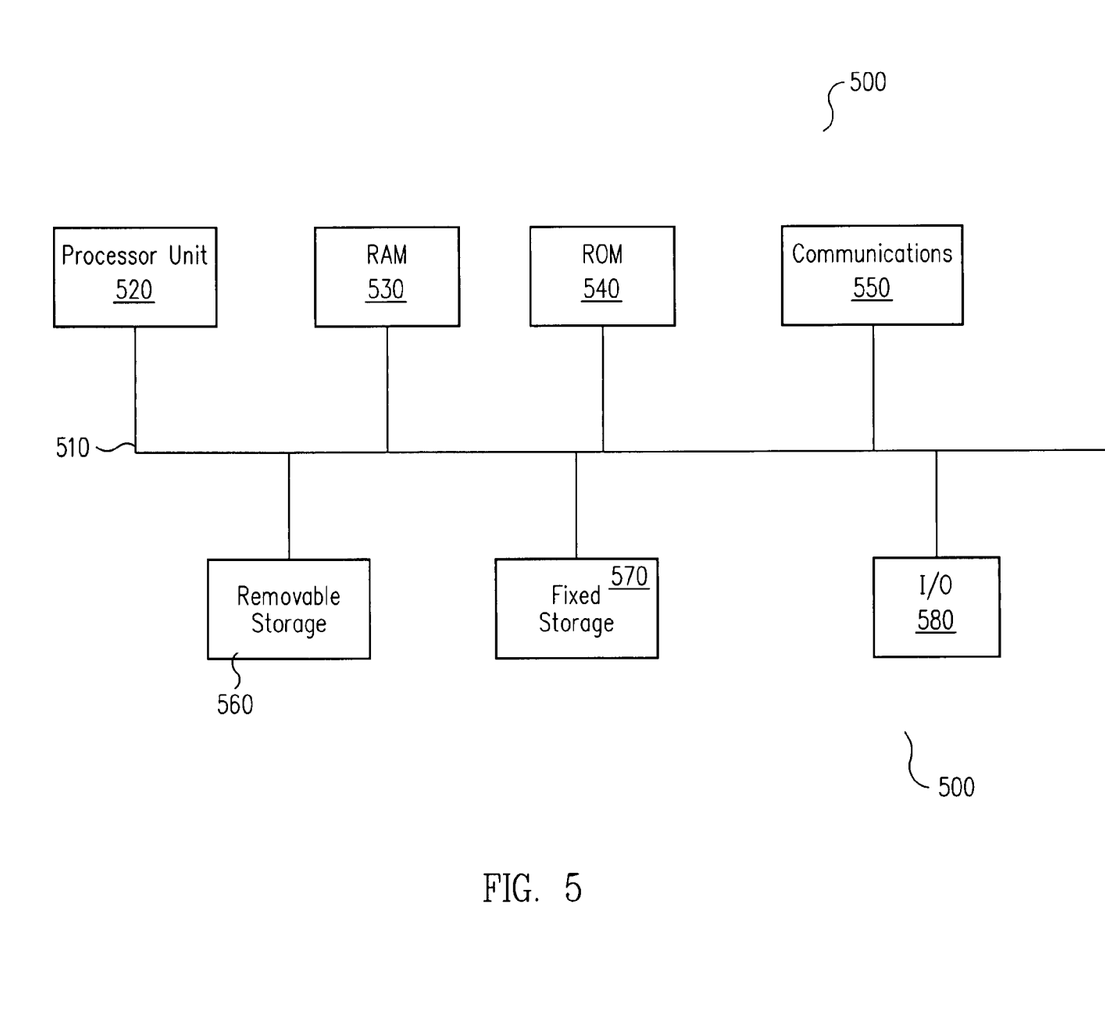
FIG. 5 is a block diagram of a processing system suitable for reading and/or executing a computer readable medium encoded with an integrated circuit design or a program of instructions.

Referring next to FIG. 5, a processor suitable for use with a computer readable medium encoding a circuit design and for use in implementing a program of instructions stored on a computer readable medium is discussed. As will be appreciated, the term "computer readable medium" encompasses memory devices such as various forms of computer memory, including for example, random access memory (RAM) and read only memory (ROM), electromagnetic disk drives, optical drives, various forms of propagated signals, magnetic tapes, optical tapes, paper tapes, and any similar medium used in transporting or storing computer readable information.

The data processor 500 illustrated in FIG. 5 includes a number of devices connected to a common system bus 510. Processor unit 520 includes one or more devices, commonly referred to as central processing units (CPU) that obtain information to be processed over system bus 510, process the information, and output results to one of the connected devices. RAM 530 and ROM 540 store programs and/or data for execution by processor unit 520. Removable storage 560 may include storage devices having removable media, such as floppy disks, compact disks, tape drives, memory sticks, and the like. Fixed storage 570 includes such devices as hard disk drives and the like that do not have removable media. Generally, both removable storage 560 and fixed storage 570 are used for bulk storage of information and/or programs. The information and programs stored fixed storage 570 and removable storage 560 are usually copied to RAM 530 for faster access by processor unit 520. Finally, communications device 550 includes network interface cards, modulator/demodulators (modems), and the like, while input output unit (I/O) 580 includes devices such as keyboards, speakers, monitors, and pointing devices.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method for predicting a timing response of a circuit path, the method comprising:
   receiving a circuit block netlist;
   obtaining a first estimated timing response of a first circuit path of said circuit block netlist using a first timing model;
   obtaining a second estimated timing response of the first circuit path of said circuit block netlist using a second timing model;
   generating a correction factor based on a variation between the first estimated timing response and the second estimated timing response, wherein generating a correction factor includes determining a statistical variation between the first estimated timing response and the second estimated timing response; and
   applying the correction factor to the first timing model.

2. The method as in claim 1 further comprising obtaining estimated timing responses of a plurality of circuit paths using the first timing model.

3. The method as in claim 2 further comprising:
   selecting the first circuit path from the plurality of circuit paths, wherein applying the correction factor to the first timing model includes adjusting the estimated timing responses of the plurality of circuit paths based on the correction factor.

4. The method as in claim 1, wherein generating a correction factor includes comparing the first estimated timing response and the second estimated timing response.

5. The method as in claim 1, wherein applying the correction factor includes adjusting the first estimated timing response based on the correction factor.

6. The method as in claim 1, wherein the first estimated timing response includes an estimated signal propagation delay.

7. The method as in claim 1, wherein the first estimated timing response includes an estimated signal propagation time.

8. The method as in claim 1, wherein the correction factor includes a scaling factor.

9. The method as in claim 1, wherein the correction factor includes an offset.

10. A method for predicting a timing response of a circuit path, the method comprising:
   obtaining coarse estimated timing responses for a plurality of circuit paths of a circuit block netlist using a first timing model, the first timing model having a first accuracy;
   obtaining refined estimated timing responses for one or more selected circuit paths of the plurality of circuit paths of said circuit block netlist using a second timing model having a second accuracy greater than the first accuracy;
   generating a correction factor based on the coarse estimated timing response of the one or more selected circuit paths and the refined timing estimates of the one or more selected circuit paths, wherein generating a correction factor includes determining a statistical variation between the coarse estimated timing response of the one or more selected circuit paths and the refined timing estimates of the one or more selected circuit paths; and
   adjusting the coarse estimated timing responses of the plurality of circuit paths based on the correction factor.

11. The method as in claim 10, wherein obtaining the coarse estimated timing responses includes estimating timing responses for the plurality of circuit paths using a modeling tool employing coarse timing assumptions.

12. The method as in claim 10, wherein obtaining refined estimated timing responses includes using a modeling tool employing refined timing assumptions.

13. The method as in claim 10, further comprising generating the circuit block netlist describing the plurality of circuit paths.

14. The method as in claim 1, further comprising:
   generating a correction factor for each of the plurality of circuit paths, wherein the statistical variation is equal to a standard deviation of the correction factors for the plurality of circuit paths divided by mean of the correction factors for the plurality of circuit paths; and
   adjusting the coarse estimated timing responses of each of the plurality of circuit paths individually, if the statistical variation exceeds twenty percent.

15. The method as in claim 10, wherein the coarse estimated timing responses include an estimated signal propagation delay.

16. The method as in claim 10, wherein the coarse estimated timing responses include an estimated signal propagation time.

17. The method as in claim 10, wherein the correction factor includes a scaling factor.

18. The method as in claim 10, wherein the correction factor includes an offset.

19. A method for generating a circuit design comprising:
   obtaining a first estimated timing response of a first circuit path of a circuit block netlist using a first timing model;
   obtaining a second estimated timing response of the first circuit path of said circuit block netlist using a second timing model;
   generating a correction factor based on a variation between the first estimated timing response and the second estimated timing response, wherein generating a correction factor includes determining a statistical variation between the first estimated timing response and the second estimated timing response;
   applying the correction factor to the first timing model to generate a corrected timing response; and
   generating a circuit design using the corrected timing response.

20. The method of claim 19 further comprising obtaining estimated timing responses of a plurality of circuit paths using the first timing model.

21. The method of claim 20, wherein applying the correction factor to the first timing model includes adjusting the first estimated timing response based on the correction factor.

22. The method of claim 20 further comprising:
   selecting the first circuit path from the plurality of circuit paths, wherein applying the correction factor to the first timing model includes adjusting the estimated timing responses of the plurality of circuit paths based on the correction factor.

23. The method of claim 19, wherein generating a correction factor includes comparing the first estimated timing response and the second estimated timing response.

24. computer readable medium tangibly embodying a program of instructions, the program of instructions comprising:
   at least one instruction executable to obtain coarse estimated timing responses for a plurality of circuit paths of a circuit block netlist using a first timing model, the first timing model having a first accuracy;
   at least one instruction executable to obtain a refined estimated timing response for a selected circuit path of the plurality of circuit paths of said circuit block netlist using a second timing model having a second accuracy greater than the first accuracy;
   at least one instruction executable to generate a correction factor based on the coarse estimated timing response of the selected circuit path and the refined timing estimate of the selected circuit path, the at least one instruction executable to generate a correction factor includes at least one instruction to determine a statistical variation between the coarse estimated timing response of the one or more selected circuit paths and the refined timing estimates of the one or more selected circuit paths; and
   at least one instruction executable to adjust the coarse estimated timing responses of the plurality of circuit paths based on the correction factor.

25. The computer readable medium as in claim 24, wherein the at least one instruction executable to obtain the coarse estimated timing responses includes at least one instruction executable to estimate timing responses for the plurality of circuit paths using a modeling tool employing coarse timing assumptions.

26. The computer readable medium as in claim 24, wherein the at least one instruction executable to obtain refined estimated timing responses includes at least one instruction to use a modeling tool employing refined timing assumptions.

27. The computer readable medium as in claim 24, further comprising at least one instruction executable to generate the circuit block netlist describing the plurality of circuit paths.

28. The computer readable medium as in claim 24, further comprising:
   at least one instruction executable to generate a correction factor for each of the plurality of circuit paths, wherein the statistical variation is equal to a standard deviation of the correction factors for the plurality of circuit paths divided by mean of the correction factors for the plurality of circuit paths; and at least one instruction executable to generate the coarse estimated timing responses of each of the plurality of circuit paths individually, if the statistical variation exceeds twenty percent.

29. The computer readable medium as in claim 24, wherein the computer readable medium is selected from a group consisting of a random access memory, a read only memory, a magnetic tape, a magnetically encodable disk, an optically encodable tape, and an optically encodable disk.

30. A system for predicting a timing response of a circuit path, the system comprising:

first timing model means for obtaining a first estimated timing response of a first circuit path of a circuit block netlist;

second timing model means for obtaining a second estimated timing response of the first circuit path of said circuit block netlist;

correction factor generation means for generating a correction factor based on a variation between the first estimated timing response and the second estimated timing response, wherein the means for generating a correction factor includes determining a statistical variation between the first estimated timing response and the second estimated timing response; and application means for applying the correction factor to the first timing model.

31. The system as in claim 30 wherein the first timing model means is further for obtaining estimated timing responses of a plurality of circuit paths.

32. The system as in claim 31 further comprising:

selection means for selecting the first circuit path from the plurality of circuit paths, wherein the application means adjusts the estimated timing responses of the plurality of circuit paths based on the correction factor.

33. The system as in claim 30, further comprising a netlist means for generating the circuit block netlist describing the plurality of circuit paths.

34. The system as in claim 30, wherein the correction factor generation means compares the first estimated timing response and the second estimated timing response.

35. The system as in claim 30, wherein the application means adjusts the first estimated timing response based on the correction factor.

* * * * *